United States Patent [19]
Hoshi

[11] Patent Number: 5,841,647
[45] Date of Patent: Nov. 24, 1998

[54] POWER CONVERSION SYSTEM

[75] Inventor: Kimihiro Hoshi, Tokyo, Japan

[73] Assignee: Kabushiki Kaisha Toshiba, Kawasaki, Japan

[21] Appl. No.: 943,805

[22] Filed: Oct. 3, 1997

[30] Foreign Application Priority Data

Oct. 7, 1996 [JP] Japan .................................... 8-264973

[51] Int. Cl.⁶ ...................... H02M 7/122; H02M 7/5387
[52] U.S. Cl. .............................................. 363/56; 363/132
[58] Field of Search ................................ 363/50, 55, 56, 363/123, 131, 132

[56] References Cited

U.S. PATENT DOCUMENTS

| | | | |
|---|---|---|---|
| 4,697,230 | 9/1987 | Neft | 363/163 |
| 4,926,306 | 5/1990 | Ueda et al. | 363/58 |
| 4,937,725 | 6/1990 | Dhyanchand et al. | 363/56 |
| 5,077,651 | 12/1991 | Kobayashi et al. | 363/56 |
| 5,424,937 | 6/1995 | Iyotani et al. | 363/136 |
| 5,579,215 | 11/1996 | Turuta | 363/57 |

*Primary Examiner*—Matthew V. Nguyen
*Attorney, Agent, or Firm*—Oblon, Spivak, McClelland, Maier & Neustadt, P.C.

[57] ABSTRACT

A power conversion system including, a series circuit of an upper arm and a lower arm connected between a positive terminal and a negative terminal of a DC power source. Each of the upper and lower arms is composed of a power device having a large dv/dt withstand value and a first snubber circuit connected in parallel with the power device. Each of the first snubber circuits is composed of at least a first capacitor having a fixed capacitance. The power conversion system further includes two second snubber circuits, each composed of a series circuit of a second diode and a second capacitor, connected in parallel with one of the upper and lower arms, and a second resistor connected between a connecting point of the second diode and the second capacitor and one of the negative and positive terminals of the DC power source, respectively.

11 Claims, 6 Drawing Sheets

POWER CONVERSION SYSTEM

BACKGROUND OF THE INVENTION

1. Field of the Invention

This invention relates to a power conversion system composed of a plurality of power devices.

2. Description of the Related Art

Semiconductor switches that are used in power conversion system, such as inverters, are not ideal switches, and therefore, methods to use them to offset their faults are demanded. One of the methods is to use a snubber circuit. For this snubber circuit, two large actions shown below are demanded.

Hereinafter, a voltage rising ratio dv/dt is simply written as dv/dt, and a current rising ratio di/dt is simply written as di/dt.

(1) An action to reduce the dv/dt applied to the semiconductor devices, and thereby to mitigate the energy burden on the semiconductor devices and prevent them from being destructed by absorbing the energy that cannot be fully absorbed by the semiconductor devices when they are turned OFF, that is, a part of turn-OFF loss in the capacitors of the snubber circuits (a charge/discharge snubber circuit).

(2) An action to suppress overvoltage v=L·di/dt generated by a line inductance (L) of the circuit when the semiconductor devices are turned OFF to below a withstand voltage of semiconductor devices (a clamp snubber circuit).

Such snubber circuits having two actions are applicable not only to conventional GTOs, but also to IGBTs, IEGTS (Injection Enhanced Gate Transistor) and hard-driven GTOs disclosed in Japanese Patent Disclosure (Kokai) No. 4-27505 and Japanese Patent Disclosure (Kohyou) No. 6-504173. As snubber circuits, corresponding to the characteristics of the respective semiconductor devices, a combination is used with a charge/discharge snubber circuit and a clamp snubber circuit.

Further, if the capacitance of a snubber capacitor in a charge/discharge snubber circuit is sufficient, the charge/discharge snubber circuit is also able to absorb the energy of the line inductance.

Here, a conventional GTO is a power device having a dv/dt withstand value of less than 1 kv/µs when turned OFF, and a power device having a larger dv/dt withstand value of, for instance, 3–10 kv/µs is called a power device having a large dv/dt withstand value (hard-driven GTO, IGBT, IEGT, etc.).

Taking the above points into consideration, an example of a conventional snubber circuit in a power conversion system will be described using FIG. 6.

FIG. 6 is a snubber circuit of a power conversion system disclosed in Japanese Patent Disclosure (Kokai) No. 4-289778. In FIG. 6, charge/discharge snubber circuits, such as RCD snubber circuits, composed of snubber resistors RS1–RS2, variable capacitance type snubber capacitors CSR1–CSR2 and snubber diodes DS1–DS2, are respectively connected to GTOs 1 which are semiconductor devices. Further, a clamp snubber circuit composed of a clamp resistor RK, a clamp capacitor CK and a clamp diode DK is commonly connected to GTOs 1.

Further, in FIG. 6, P and N are a positive side terminal and a negative side terminal of a DC power source, L is an AC output terminal of the power conversion system, LA is an anode reactor, DLA is a diode and RLA is a resistor.

In FIG. 6, when GTO 1 of an upper arm is turned OFF, a load current flows to the upper RCD snubber circuit of GTO 1 to overcharge the voltage applied to GTO 1 to above the supply voltage. However, when snubber capacitor CSR1 of GTO 1 is likely to be overcharged to more than the supply voltage, its overcharged energy is shunted to clamp capacitor CK having a larger capacitance than that of snubber capacitor CSR1, and thus, the overcharged voltage of snubber capacitor CSR1 can be suppressed.

However, in the conventional charge/discharge snubber circuit in the power conversion system described above, a variable capacitance type snubber capacitor is used which has such a characteristic that the capacitance becomes high in a low voltage area and low in a high voltage area so as to reduce the snubber loss and to suppress the overvoltage. Here, the capacitance of the variable capacitance type snubber capacitor becomes very low in a higher voltage area than the voltage of DC power source, and is not sufficient to suppress the overvoltage. In order to suppress the overvoltage, therefore, clamp capacitor CK is provided separately. For instance, when a semiconductor device requiring a large capacitance for a capacitor at the beginning of the turn-OFF operation to suppress the dv/dt, such as a conventional GTO, is used in the power conversion system, such a variable capacitance type capacitor may be used in the snubber circuit. This is because in case of a conventional GTO, the capacitance of a capacitor required for suppressing the dv/dt when it is turned OFF is larger than that required for absorbing the energy of the line inductance when the GTO is turned OFF. Accordingly, even when a variable capacitance type capacitor is used in a charge/discharge snubber circuit, it is able to perform the duty of a snubber circuit.

However, as a capacitor of fixed small capacitance is sufficient for a semiconductor device having a large dv/dt withstand value, it is not necessary to daringly use a variable type capacitor that is inconvenient to handle. In this regard, a MOS gate type semiconductor device, for instance an IGBT, has a large dv/dt withstand value, and at the beginning of the turn OFF operation, it does not require a capacitor at all (in case of a low-voltage IGBT) or does not require a capacitor of a large capacitance (in case of a high-voltage IGBT). In this case, a small capacitance is sufficient for a snubber capacitor. Accordingly, it is questionable to use a variable type capacitor in the snubber circuit because a loss in the snubber circuit is increased.

Further, in case of a power device having a larger dv/dt withstand value than the conventional GTO, such as an IEGT and a hard driven GTO, as the action required for a snubber circuit, an action to absorb the energy of the line inductance is demanded rather than an action to suppress the dv/dt. In other words, for these semiconductor devices, the capacitance of a capacitor of a charge/discharge snubber circuit can be smaller than that in the case of the conventional GTO, and the capacitance of a capacitor of a clamp snubber circuit is rather larger than that of a charge/discharge snubber circuit. It is therefor not necessary to use a variable capacitance type capacitor for a charge/discharge snubber circuit.

Further, when the clamp snubber circuit is provided commonly to the upper and lower arm semiconductor devices as shown in FIG. 6, if a difference in overvoltage is generated between these semiconductor devices, there is a problem that it is not adaptable to these upper and lower arms individually.

SUMMARY OF THE INVENTION

Accordingly, one object of this invention is to provide a power conversion system composed of a plurality of power devices having a large dv/dt withstand value which is capable of protecting the power devices from being destructed, reducing the power loss in snubber circuits when these power devices are turned OFF, and further suppressing the overvoltage of the arms individually, by suppressing the dv/dt and the overvoltage.

These and other objects of this invention can be achieved by providing a power conversion system including, a series circuit of an upper arm and a lower arm connected between a positive terminal and a negative terminal of a DC power source. Each of the upper and lower arms is composed of a power device having a large dv/dt withstand value and a first snubber circuit connected in parallel with the power device. Each of the first snubber circuits is composed of at least a first capacitor having a fixed capacitance. The power conversion system further includes two second snubber circuits, each composed of a series circuit of a second diode and a second capacitor, connected in parallel with one of the upper and lower arms, and a second resistor connected between a connecting point of the second diode and the second capacitor and one of the negative and positive terminals of the DC power source, respectively.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
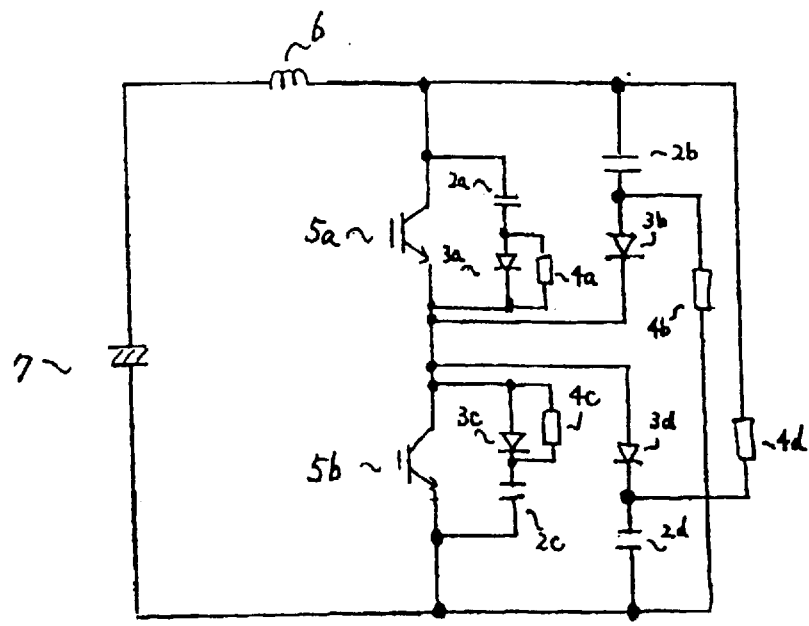
FIG. 1 is a block diagram showing a construction of a part of a power conversion system according to a first embodiment of this invention.

Referring now to the drawings, wherein like reference numerals designate identical or corresponding parts throughout the several views, the embodiments of this invention will be described below.

A first embodiment of this invention will be described using FIG. 1. In FIG. 1, a charge/discharge snubber circuit, such as an RCD snubber circuit, composed of a capacitor 2a, a diode 3a and a resistor 4a and a clamp snubber circuit composed of a capacitor 2b, a diode 3b and a resistor 4b are provided for an IGBT 5a in the upper arm of a power conversion system. Further, for an IGBT 5b in the lower arm, a charge/discharge snubber circuit, such as an RCD snubber circuit, composed of a capacitor 2c, a diode 3c and a resistor 4c and a clamp snubber circuit composed of a capacitor 2d, a diode 3d and a resistor 4d are provided. In FIG. 1, 6 is a line inductance and 7 is a DC power source.

The current flowing to IGBT 5a is absorbed by capacitor 2a via diode 3a of the upper RCD snubber circuit so that high voltage and large current are not simultaneously applied to IGBT 5a when the current is cut OFF. Namely, as for the voltage applied to IGBT 5a, the dv/dt is suppressed when capacitor 2a is charged. Accordingly, high voltage and large current are not simultaneously applied to IGBT 5a and IGBT 5a will not be destructed. The charge stored in capacitor 2a is consumed through resistor 4a and IGBT 5a and the power is thus lost at the time of next turn-ON. Therefore, from the viewpoint of the power loss, it is better that the capacitance of capacitor 2a is rather small. However, if the capacitance of capacitor 2a is too small, the dv/dt is not suppressed and high voltage and large current are simultaneously applied to IGBT 5a. It is, therefore, necessary to keep the capacitance of capacitor 2a at such a value that IGBT 5a is not destructed.

Next, the overvoltage generated by line inductance 6 when the current is cut OFF is not suppressed by capacitor 2a in the RCD snubber circuit, because the capacitance of capacitor 2a is small. This overvoltage is instead suppressed by the clamp snubber circuit which is provided separately from the RCD snubber circuit. For this reason, the capacitance of capacitor 2a in the RCD snubber circuit is made smaller than that of capacitor 2b in the clamp snubber circuit. Capacitor 2b in the clamp snubber circuit is already charged up to the circuit voltage and it acts as a capacitor against the overvoltage above the circuit voltage. In other words, the energy of line inductance 6 is charged in capacitor 2b through diode 3b, and as a result, it becomes possible to suppress the overvoltage generated by line inductance 6.

Further, the capacitance of capacitor 2b is determined based on a magnitude of withstand voltage of IGBT 5a and that of line inductance 6. The larger line inductance 6 is, the larger the overvoltage is generated. However, a value of the overvoltage should be less than the withstand voltage of IGBT 5a.

Therefore, it is necessary to determine the capacitance of capacitor 2b to such a value that IGBT 5a is not destructed by the overvoltage.

As described above, in this embodiment, the dv/dt is suppressed by the RCD snubber circuit and the overvoltage generated by the line inductance is suppressed by the clamp snubber circuit. Further, from the viewpoint of the power loss, it is sufficient for the capacitor of the RCD snubber circuit to suppress the dv/dt to such a level that the IGBT is not destructed, and thereforte, a very small capacitance is sufficient. Accordingly, as the capacitor of the RCD snubber circuit, a capacitor of a fixed small capacitance is usable, and even when it is completely charged or discharged, the snubber loss can be minimized. Further, in the clamp snubber circuit the power loss is less, as the charge of the capacitor is discharged up to the circuit voltage even when the capacitor has a large capacitance. Further, each IGBT is provided with the clamp snubber circuit, it is possible to suppress the overvoltage corresponding to each IGBT individually.

Further, although not illustrated, it is possible to suppress spike voltage by connecting a Zener diode to each of capacitors 2a, 2b in parallel as a voltage clamp circuit. This construction, action and effect are also applicable to the embodiments shown below.

Next, a second embodiment of this invention will be described using FIG. 2.

This embodiment is the same as the first embodiment in that the clamp snubber circuits are connected, and differs in that as the charge/discharge snubber circuits, RC snubber circuits are used instead of the RCD snubber circuits. That is, in FIG. 2, diodes 3a and 3d used in the embodiment shown in FIG. 1 are omitted. As a result of the use of the RC snubber circuits, the current to be charged in capacitor 2a is charged by way of resistor 4a. The capability of suppressing dv/dt in this embodiment becomes inferior to that of the RCD snubber circuit in the first embodiment. However, it is possible to suppress the dv/dt in this embodiment rather than a snubber circuit construction composed of only the clamp snubber circuit. Capacitor 2a and resistor 4a should be set as described below. That is, the capacitance of capacitor 2a should be set at a value larger than a value to suppress the dv/dt so that IGBT 5a is not destructed, and the resistance of resistor 4a should be set at a value smaller than a value to suppress the dv/dt so that IGBT 5a is not destructed As described above, it is possible to suppress the dv/dt and the overvoltage according to this embodiment likewise the first embodiment. Further, this embodiment has a merit in the following point when compared with the first embodiment. That is, in the first embodiment when the operation is started from the state where a voltage of DC power source 7 is E and both IGBTS 5a, 5b are OFF, the voltages of snubber capacitors 2a and 2c of the RCD snubber circuits become E/2, respectively. When either one of IGBTs 5a, 5b is turned ON, the snubber capacitor connected to the other IGBT is rapidly charged to E from E/2. The charging current is not able to suppress the di/dt because there is line inductance 6 only in the route of the charging current as an impedance component. If there is a possibility for destructing IGBTs 5a, 5b by the di/dt at the time of their turn-ON, it is necessary to add an anode reactor, etc. in order to increase the inductance thereby to suppress the di/dt. This will result in an increase of the power loss in the snubber circuit. However, in this embodiment, resistors 4a, 4c are respectively connected to capacitors 2a, 2c in series in the RC snubber circuits, and therefore, it is necessary to provide an anode reactor for the reason of the above cause as in the first embodiment. Accordingly, it is possible to further reduce the power loss.

Next, a third embodiment of this invention will be described using FIG. 3.

This embodiment is the same as the first embodiment in that the clamp snubber circuits are connected and differs in that as the charge/discharge snubber circuit snubber circuits composed of only capacitors 2a, 2c are used instead of the RCD snubber circuits. That is, in FIG. 3, diodes 3a and 3d and resistors 4a, 4c used in the embodiment shown in FIG. 1 are omitted. As a result of the use of the snubber circuits composed of only capacitors 2a, 2c instead of the RCD snubber circuits or the RC snubber circuits, this embodiment differs from the first and second embodiments in the following points. In this embodiment, when IGBTs 5a, 5b are turned ON, the charges of capacitors 2a, 2c are directly discharged to IGBTs 5a, 5b without passing through resistors 4a, 4c. As a result, it becomes difficult to suppress the di/dt. However, in the case where the capacitances of capacitors 2a, 2c can be very small or the di/dt withstand value of IGBTs 5a, 5b are large, there is no problem even when the charges of capacitors 2a, 2c are discharged without passing through resistors 4a, 4c, respectively. Further, in this embodiment, the circuit configuration can be simplified and the reliability of the entire power conversion system is improved. In addition, this embodiment has a larger dv/dt suppression effect than the first and second embodiments.

Figure 4:
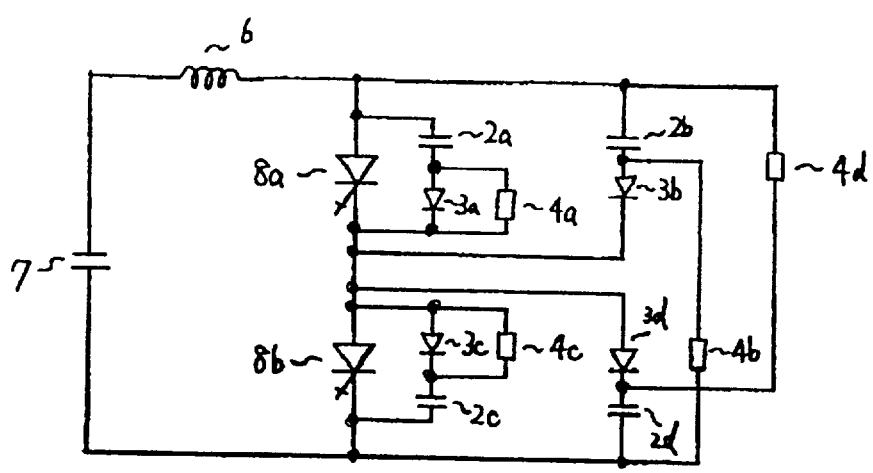
FIG. 4 is a block diagram showing a construction of a part of a power conversion system according to a fourth embodiment of this invention.

Although the cases where as the semiconductor devices IGBTs are used are described in the above embodiments, this invention is applicable to a power conversion system composed of semiconductor power devices having a large dv/dt withstand value, for instance, IEGTs or hard-driven GTOs. As one example of such a power conversion system, a fourth embodiment of this invention is shown in FIG. 4. In FIG. 4, hard-driven GTO 8a, 8b are used instead of IGBTs 5a, 5c in the first embodiment shown in FIG. 1.

Figure 2:
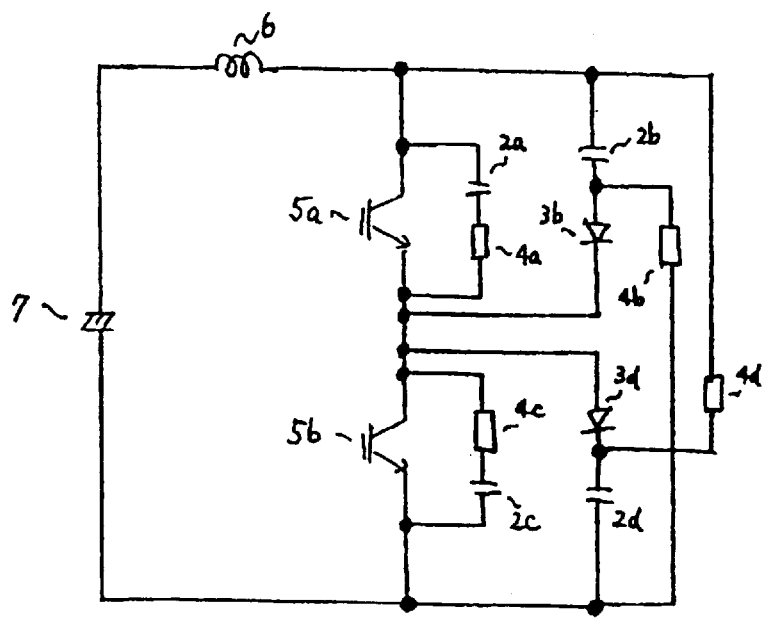
FIG. 2 is a block diagram showing a construction of a part of a power conversion system according to a second embodiment of this invention.
Figure 3:
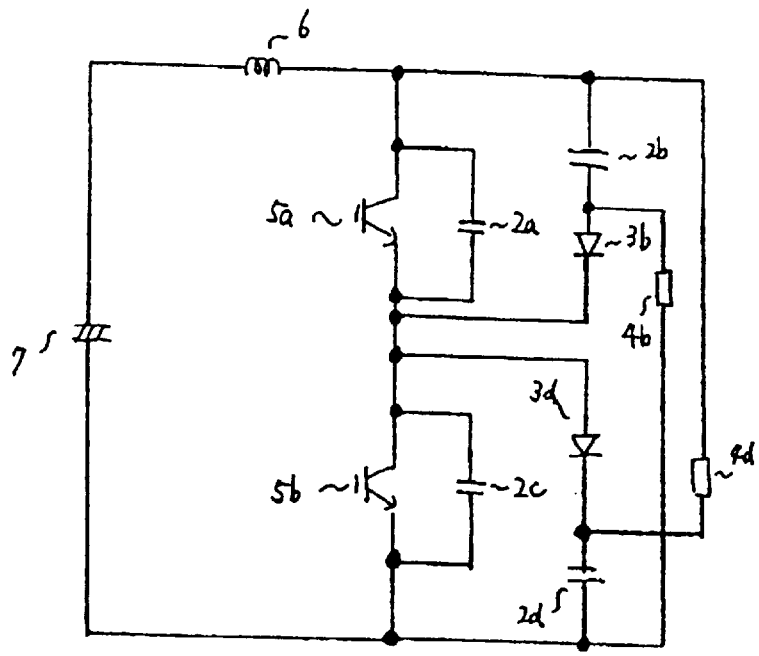
FIG. 3 is a block diagram showing a construction of a part of a power conversion system according to a third embodiment of this invention.

Furthermore, it is possible to use power devices having a large dv/dt withstand value instead of GTOs 5a, 5b in the power conversion system shown in FIGS. 2 and 3.

Figure 5A:
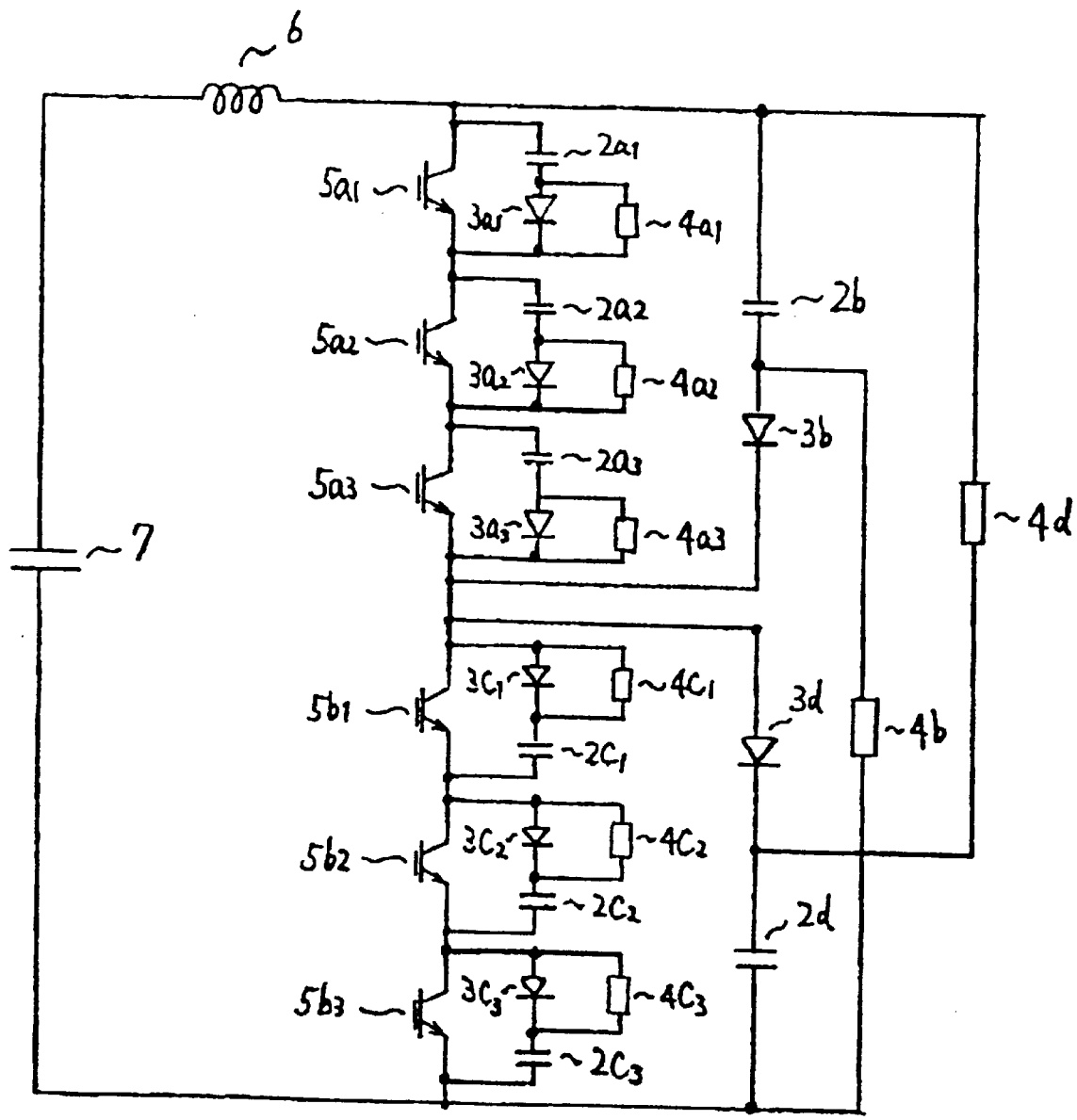
FIG. 5A is a block diagram showing a construction of a part of a power conversion system according to a fifth embodiment of this invention.

Next, a fifth embodiment of this invention will be described using FIG. 5A. In FIG. 5A, a power conversion system is constructed such that power devices are connected in series in the upper and lower arms, respectively, so as to provide a high voltage power conversion system. In FIG. 5A, IGBTs 5a, 5b, capacitors 2a, 2c, diodes 3a, 3c and resistors 4a, 4a are used by three pieces, respectively, and they are discriminated by adding suffixes 1, 2 and 3 to their reference numerals, respectively. As for the clamp snubber circuits, each of clamp snubber circuits is connected to one of the upper and lower arms, respectively, as in the first embodiment.

In this embodiment, it is possible to obtain the similar effects that are obtained in the above embodiments. In addition, another effect can be expected that it becomes easy to equalize the series sharing voltages of IGBTs 5a1, 5a2 and 5a3 in the upper arm or IGBTs 5b1, 5b2 and 5b3 in the lower arm at the time of turn-OFF thereof if the dv/dt is reduced slightly by the charge/discharge snubber circuits.

Furthermore, it is possible to use power devices, such as hard-driven GTOs, having a large dv/dt withstand value instead of GTOs 5a, 5b in the power conversion system in the above embodiments.

Figure 5B:
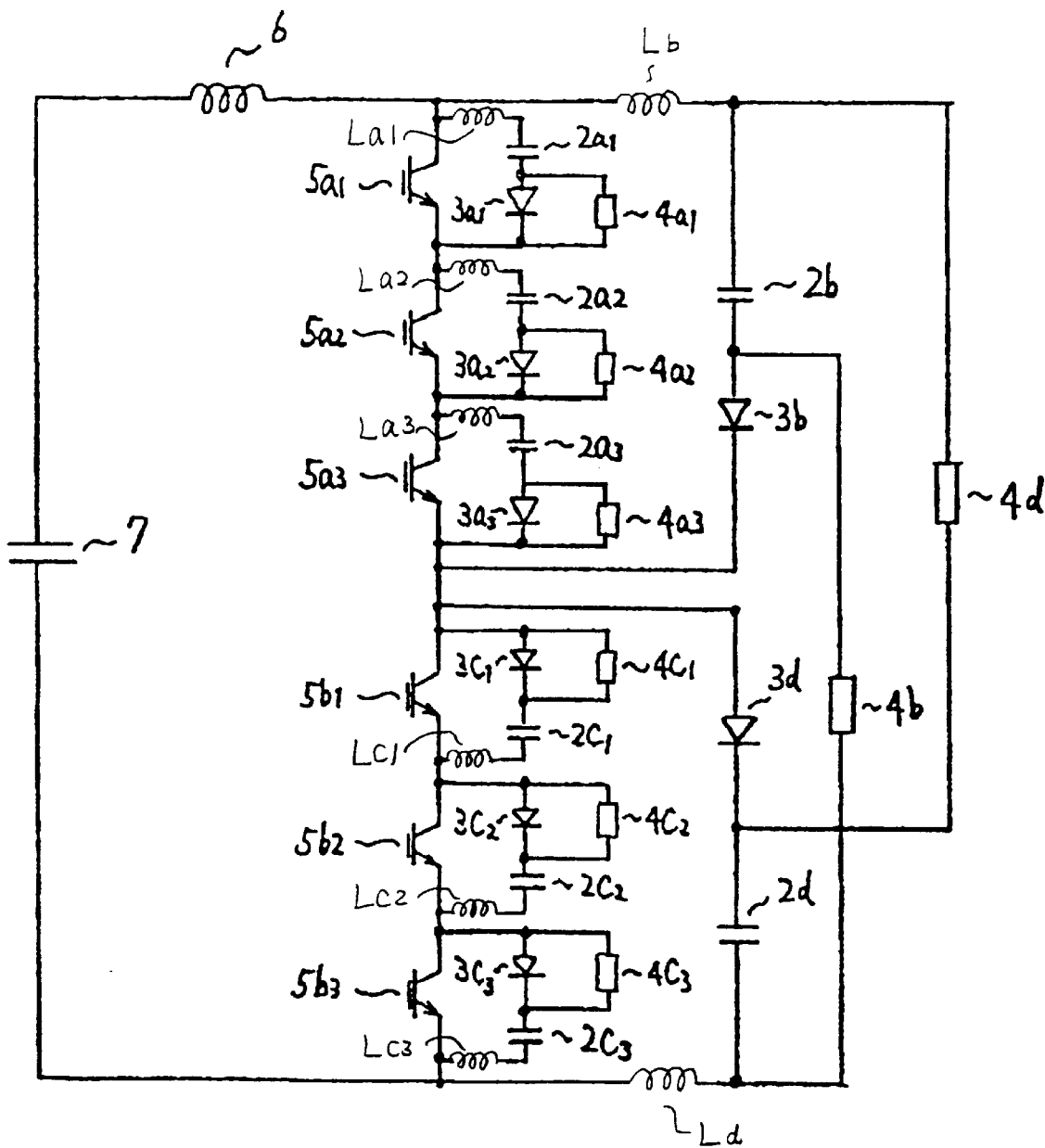
FIG. 5B is a block diagram for explaining the action of the embodiment shown in FIG. 5A.

Next, FIG. 5B is a block diagram for explaining the action of the power conversion system shown in FIG. 5A. In the circuit configuration of the power conversion system shown in FIG. 5A, the charge/discharge snubber circuits (RCD snubber circuits) are provided near the respective IGBTs 5a1, 5a2, 5a3 and IGBTs 5b1, 5b2 and 5b3. As a result, the line inductances shown by reference numerals La1, La2, La3 and Lc1, Lc2, Lc3 in FIG. 5B of the charge/discharge snubber circuits are small. On the other hand, the line inductances shown by reference numerals Lb, Ld in FIG. 5B of the clamp snubber circuits provided collectively for the upper and lower arms, respectively, are larger. In case when IGBTs 5a1, 5a2, 5a3 or IGBTs 5b1, 5b2 and 5b3 are turned OFF, and the charged voltages of capacitors 2a1, 2a2, 2a3 or capacitors 2c1, 2c2, 2c3 in the charge/discharge snubber circuits becomes larger than the one third (E/3) of supply voltage of DC power source 7, the energy stored in line inductance 6 are not charged into capacitors 2b or 2d of the clamp snubber circuit and are all charged into capacitors 2a1, 2a2, 2a3 or capacitors 2c1, 2c2, 2c3 in the charge/discharge snubber circuit, instead. As the capacitaces of capacitors 2a1, 2a2, 2a3 or capacitors 2c1, 2c2, 2c3 in the charge/discharge snubber circuits are very small, the charged voltages of capacitors 2a1, 2a2, 2a3 or capacitors 2c1, 2c2, 2c3 becomes extremely high, with the result that IGBTs 5a1, 5a2, 5a3 or IGBTs 5b1, 5b2 and 5b3 may be destructed by the overvoltage.

Figure 5C:
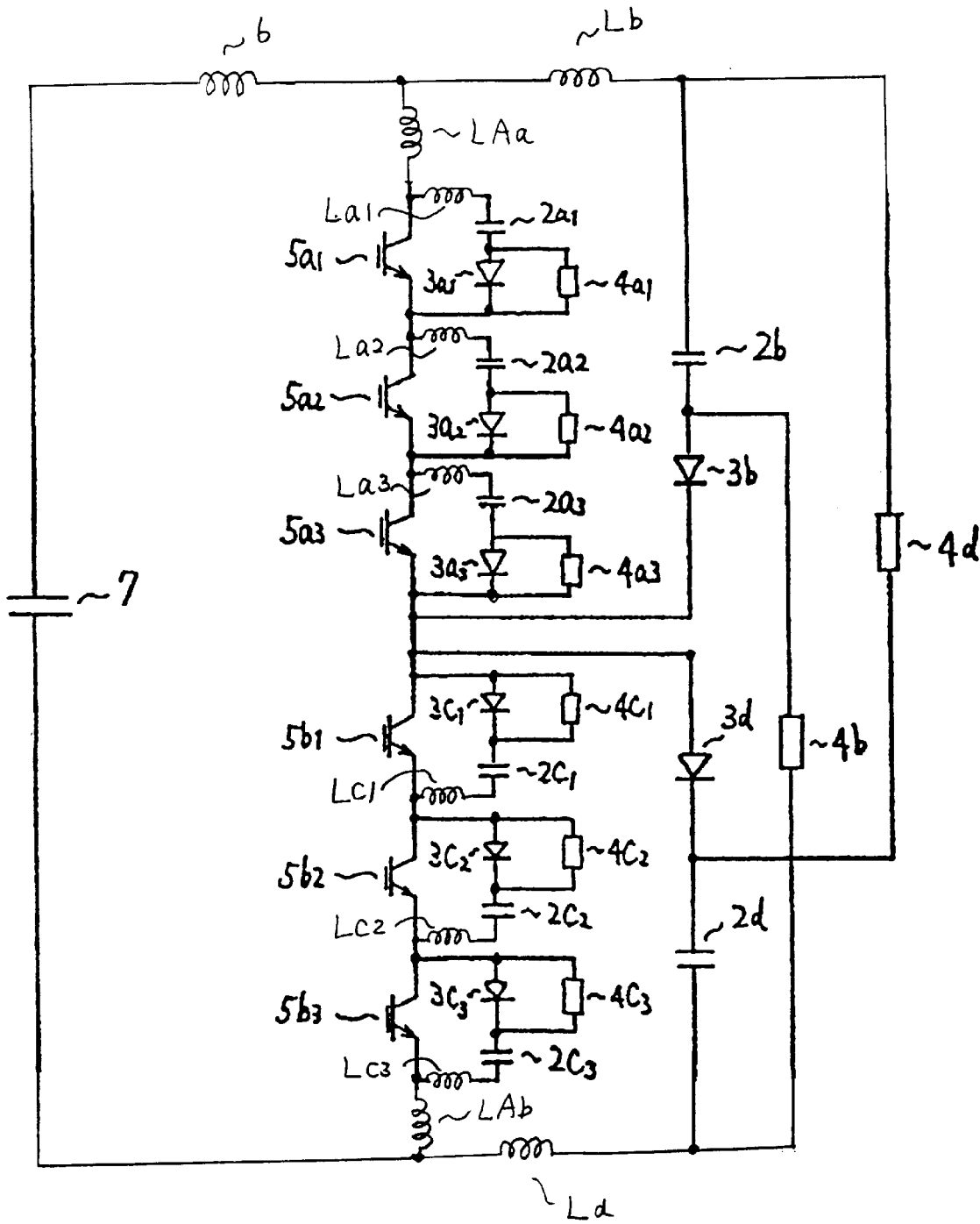
FIG. 5C is a block diagram showing a construction of a part of a power conversion system according to a sixth embodiment of this invention.
Figure 6:
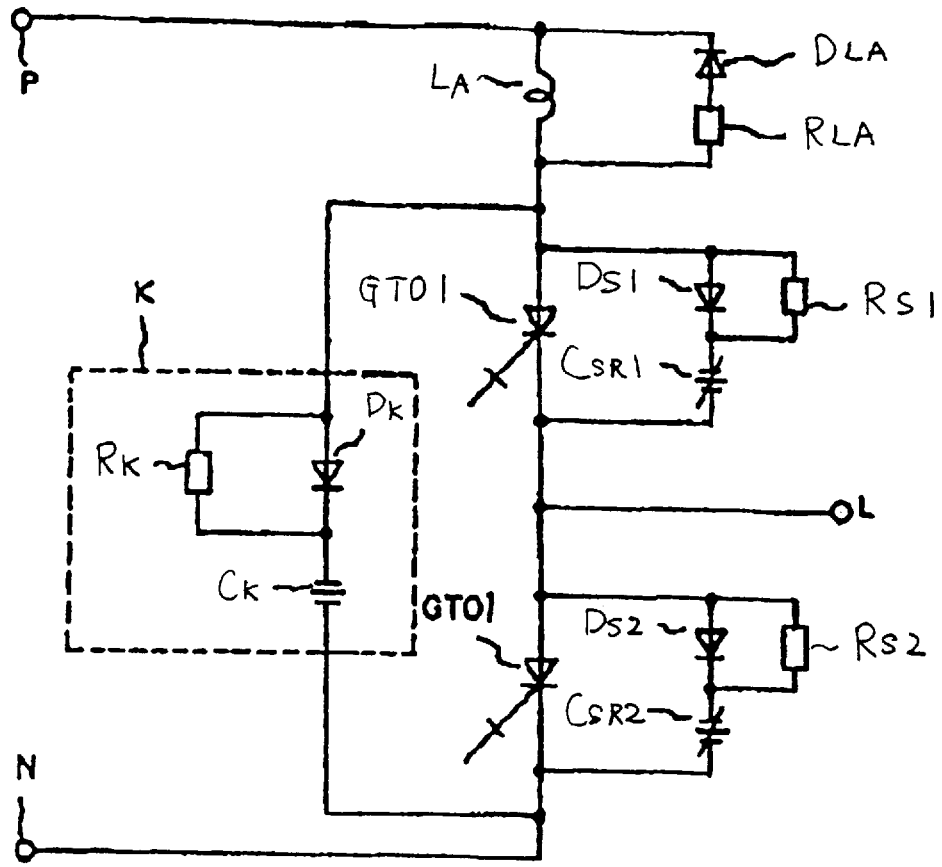
FIG. 6 is a block diagram showing a construction of a part of a conventional power conversion system.

In order to avoid such destruction of the IGBTs, a sixth embodiment is provided as shown in FIG. 5C. This embodiment is the same as the fifth embodiment except that anode reactors LAa and LAb are further provided in the upper and lower arms, respectively, as shown in FIG. 5C. The inductances of anode reactors LAa and LAb are determined by the following expression:

inductance of anode reactor LAa (LAb) +line inductances of (La1+La2+La3) ((Lc1+Lc2+Lc3)) >line inductance of Lb(Ld)

By providing such anode reactors LAa and LAb in the upper and lower arms, when the voltage applied to the upper or lower arm becomes larger than power supply voltage E, the energy stored in line inductance 6 is mostly charged by capacitor $2b$ or $2d$ in the upper or lower clamp snubber circuit. As a result, the overvoltages applied to IGBTs $5a1$, $5a2$, $5a3$ or IGBTs $5b1$, $5b2$ and $5b3$ are suppressed thereby to prevent them from being destructed.

As described above, according to this invention, it becomes possible to provide a power conversion system composed of a plurality of power devices having a large dv/dt withstand value which is capable of protecting the power devices from being destructed, reducing the power loss in snubber circuits when these power devices are turned OFF, and further suppressing the overvoltage of the arms individually, by suppressing the dv/dt and the overvoltage.

Obviously, numerous modifications and variations of the present invention are possible in light of the above teachings. It is therefore to be understood that within the scope of the appended claims, the invention may be practiced otherwise than as specifically described herein.

What is claimed is:

1. A power conversion system, comprising:

a series circuit of an upper arm and a lower arm connected between a positive terminal and a negative terminal of a DC power source;

each of said upper and lower arms being composed of a power device having a large dv/dt withstand value and a first snubber circuit connected in parallel with said power device;

each of said first snubber circuits being composed of at least a first capacitor having a fixed capacitance; and two second snubber circuits, each composed of a series circuit of a second diode and a second capacitor, connected in parallel with one of said upper and lower arms, and a second resistor connected between a connecting point of said second diode and said second capacitor and one of said negative and positive terminals of said DC power source, respectively.

2. The power conversion system according to claim 1, wherein:

each of said first snubber circuits is composed of a series circuit of said first capacitor and a parallel circuit of a first resistor and a first diode.

3. The power conversion system according to claim 1, wherein:

each of said first snubber circuits is composed of a series circuit of said first capacitor and a first resistor.

4. The power conversion system according to one of claims 1, 2 and 3, wherein:

a capacitance of said first capacitor in said first snubber circuit is smaller than a capacitance of said second capacitor in said second snubber circuit and is larger than a capacitance required for suppressing the dv/dt when said power device is turned OFF.

5. The power conversion system according to one of claims 1, 2 and 3, wherein:

each of said first snubber circuits further includes a voltage clamp circuit connected in parallel with said first capacitor.

6. The power conversion system according to one of claims 1, 2 and 3, wherein:

each of said upper and lower arms is composed of a series circuit of a plurality of said power devices having said large dv/dt withstand value and a plurality of said first snubber circuits, each connected in parallel with one of said power devices, respectively.

7. The power conversion system according to claim 6, wherein:

a capacitance of said first capacitor in said first snubber circuit is smaller than a capacitance of said second capacitor in said second snubber circuit and is larger than a capacitance required for suppressing the dv/dt when said power device is turned OFF.

8. The power conversion system according to claim 6, wherein:

each of said first snubber circuits further includes a voltage clamp circuit connected in parallel with said first capacitor.

9. The power conversion system according to one of claims 1, 2 and 3, wherein:

each of said upper and lower arms is composed of a series circuit of an anode reactor and a plurality of said power devices having said large dv/dt withstand value, and a plurality of said first snubber circuits, each connected in parallel with one of said power devices, respectively.

10. The power conversion system according to claim 9, wherein:

a capacitance of said first capacitor in said first snubber circuit is smaller than a capacitance of said second capacitor in said second snubber circuit and is larger than a capacitance required for suppressing the dv/dt when said power device is turned OFF.

11. The power conversion system according to claim 9, wherein:

each of said first snubber circuits further includes a voltage clamp circuit connected in parallel with said first capacitor.

* * * * *